United States Patent
Shotokuji et al.

(10) Patent No.: US 9,761,492 B2
(45) Date of Patent: Sep. 12, 2017

(54) PROCESSING METHOD OF OPTICAL DEVICE WAFER

(71) Applicant: DISCO CORPORATION, Tokyo (JP)

(72) Inventors: Takumi Shotokuji, Tokyo (JP); Noboru Takeda, Tokyo (JP); Naotoshi Kirihara, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/291,746

(22) Filed: Oct. 12, 2016

(65) Prior Publication Data
US 2017/0103921 A1    Apr. 13, 2017

(30) Foreign Application Priority Data
Oct. 13, 2015  (JP) ................................ 2015-202320

(51) Int. Cl.
| H01L 21/78  | (2006.01) |
| H01L 21/268 | (2006.01) |
| H01L 33/00  | (2010.01) |
| H01L 33/48  | (2010.01) |
| H01L 33/62  | (2010.01) |

(52) U.S. Cl.
CPC ............ *H01L 21/78* (2013.01); *H01L 21/268* (2013.01); *H01L 33/0066* (2013.01); *H01L 33/0075* (2013.01); *H01L 33/486* (2013.01); *H01L 33/62* (2013.01); *H01L 2933/0033* (2013.01)

(58) Field of Classification Search
CPC ... H01L 21/78; H01L 21/268; H01L 33/0066; H01L 33/0075; H01L 33/486; H01L 33/62; H01L 2933/0033
See application file for complete search history.

(56) References Cited

U.S. PATENT DOCUMENTS

| 8,487,208 B2* | 7/2013  | Kobayashi | B23K 26/0853 |
|               |         |           | 219/121.61   |
| 9,349,646 B2* | 5/2016  | Morikazu  | H01L 21/78   |
| 9,517,962 B2* | 12/2016 | Takeda    | C03B 33/0222 |
| 9,536,786 B2* | 1/2017  | Morikazu  | H01L 21/78   |
| 9,543,466 B2* | 1/2017  | Morikazu  | H01L 33/0095 |

(Continued)

FOREIGN PATENT DOCUMENTS

| JP | 10-305420   | 11/1998 |
| JP | 2002-192370 | 7/2002  |
| JP | 2014-221483 | 11/2014 |

*Primary Examiner* — Savitr Mulpuri
(74) *Attorney, Agent, or Firm* — Greer Burns & Crain, Ltd.

(57) ABSTRACT

A processing method for optical device wafers includes a shielded tunnel forming step and a dividing step. In the shielded tunnel forming step, a sapphire substrate is irradiated with a pulse laser beam having such a wavelength as to be transmitted through the sapphire substrate along regions corresponding to planned dividing lines. The light focus point of the beam is positioned inside the substrate from the back surface side of the substrate. Fine pores and amorphous regions that shield the fine pores form shielded tunnels along the planned dividing lines. In the dividing step, an external force is applied to the optical device wafer, and the optical device wafer is divided into individual optical device chips along the planned dividing lines. In the shielded tunnel forming step, a spherical aberration is generated by causing the laser beam to be incident on a condensing lens with a divergence angle.

2 Claims, 8 Drawing Sheets

(56) References Cited

U.S. PATENT DOCUMENTS

| | | | | |
|---|---|---|---|---|
| 2009/0124063 A1* | 5/2009 | Nakamura | ............ | B23K 26/009 438/463 |
| 2012/0111495 A1* | 5/2012 | Shimoi | .............. | B23K 26/0057 156/250 |
| 2014/0213040 A1* | 7/2014 | Morikazu | ................ | H01L 21/78 438/462 |
| 2014/0256150 A1* | 9/2014 | Morikazu | ............. | H01L 21/263 438/746 |
| 2014/0334511 A1* | 11/2014 | Takeda | ...................... | H01S 3/10 372/41 |
| 2017/0103921 A1* | 4/2017 | Shotokuji | ............. | H01L 21/268 |

* cited by examiner

PROCESSING METHOD OF OPTICAL DEVICE WAFER

BACKGROUND OF THE INVENTION

Field of the Invention

The present invention relates to a processing method of an optical device wafer in which the optical device wafer obtained by forming a light emitting layer on a surface of a sapphire substrate and forming an optical device in each of plural regions marked out by plural planned dividing lines in a lattice manner is divided into individual optical device chips along the planned dividing lines.

Description of the Related Art

In an optical device manufacturing process, an optical device wafer is configured by stacking a light emitting layer (epitaxial layer) composed of an n-type gallium nitride semiconductor layer and a p-type gallium nitride semiconductor layer on a surface of a sapphire substrate having a substantially circular disc shape and forming optical devices such as light emitting diodes and laser diodes in plural regions marked out by plural planned dividing lines formed in a lattice manner. Then, the regions in which the optical devices are formed are separated by cutting the optical device wafer along the planned dividing lines to manufacture the individual optical device chips.

The above-described cutting of the optical device wafer along the planned dividing lines is normally carried out by cutting apparatus called a dicing saw. This cutting apparatus includes a chuck table that holds a processing-target object, cutting means for cutting the processing-target object held by this chuck table, and cutting feed means that moves the chuck table and the cutting means relatively. The cutting means includes a spindle, a cutting blade mounted to this spindle, and a drive mechanism that rotationally drives the spindle. The cutting blade is composed of a base having a circular disc shape and a ring-shaped cutting edge mounted to the outer circumferential part of the side surface of this base. The cutting edge is obtained by fixing e.g. diamond abrasive grains with a grain size of approximately 3 µm to the base by electro-forming and is formed to a thickness of approximately 20 µm.

However, the sapphire substrate forming the optical device wafer has high Mohs hardness and the cutting by the cutting blade is not necessarily easy. Furthermore, because the cutting blade has a thickness of approximately 20 µm, the width of the planned dividing lines that mark out the devices needs to be approximately 50 µm. For this reason, there is a problem that the area ratio occupied by the planned dividing lines is high and the productivity is low.

To solve the above-described problem, the following method has been proposed as a method for dividing an optical device wafer along planned dividing lines. Specifically, laser-processed grooves serving as the start point of breaking are formed by irradiating a sapphire substrate with a pulse laser beam having such a wavelength as to be absorbed by the sapphire substrate along the planned dividing lines. Then, the wafer is split by giving an external force along the planned dividing lines along which the laser-processed grooves serving as the start point of breaking are formed (for example, refer to Japanese Patent Laid-Open No. 1998-305420).

However, there is the following problem when the laser-processed grooves are formed through irradiation with a laser beam along the planned dividing lines formed on a surface of the sapphire substrate forming the optical device wafer. Specifically, the outer circumferences of the optical devices such as light emitting diodes are subjected to ablation and a melted object called debris adheres to the optical devices. Thus, the luminance decreases and the quality of the optical devices is lowered.

To solve such a problem, the following processing method has been disclosed in Japanese Patent No. 3408805. Specifically, modified layers are formed inside a sapphire substrate on which a light emitting layer (epitaxial layer) is not formed along planned dividing lines by irradiating the sapphire substrate with a laser beam having such a wavelength as to be transmitted through the sapphire substrate along the planned dividing lines from the back surface side of the sapphire substrate, with the light focus point of the laser beam positioned inside the sapphire substrate. Thereby, the sapphire substrate is divided along the planned dividing lines along which the strength is lowered due to the formation of the modified layers.

However, when the modified layers are formed inside the sapphire substrate along the planned dividing lines, there are problems that the side surfaces of the optical devices are covered by the modified layers and the flexural strength or die strength of the optical devices is lowered and that it is impossible to vertically divide the sapphire substrate over the range from the back surface to the front surface.

To solve such a problem, the following laser processing method has been disclosed in Japanese Patent Laid-Open No. 2014-221483. Specifically, the numerical aperture (NA) of a condensing lens to condense a pulse laser beam is so set that a value obtained by dividing the numerical aperture (NA) of the condensing lens by the refractive index (N) of a single-crystal substrate is in a range of 0.05 to 0.2. Then, the single-crystal substrate is irradiated with a pulse laser beam condensed by this condensing lens and fine pores and amorphous regions that shield the fine pores are grown between the light focus point positioned in the single-crystal substrate and the incidence side of the pulse laser beam to form shielded tunnels.

SUMMARY OF THE INVENTION

By carrying out laser processing for a sapphire substrate forming an optical device wafer along planned dividing lines by the laser processing method described in Japanese Patent Laid-Open No. 2014-221483, the shielded tunnels can be formed through growth of fine pores and amorphous regions that shield the fine pores over the range from the back surface of the sapphire substrate to the front surface. Thus, the optical device wafer can be vertically divided along the planned dividing lines. In addition, the lowering of quality and flexural strength of the optical devices due to scattering of debris can be prevented.

Figure 8:
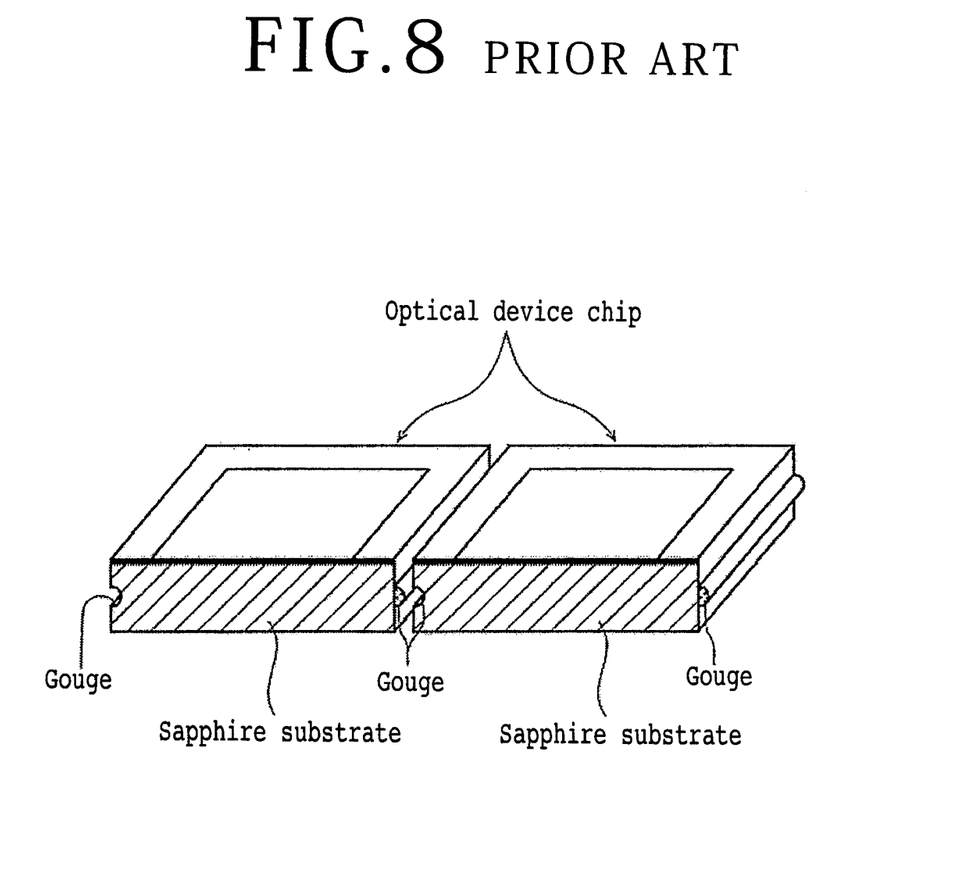
FIG. 8 is a perspective view of optical devices obtained by dividing an optical device wafer into individual chips by a processing method of a prior art.

However, when the shielded tunnels are formed by carrying out the laser processing for the sapphire substrate forming the optical device wafer along the planned dividing lines by the laser processing method described in Japanese Patent Laid-Open No. 2014-221483, a new problem is caused that, as shown in FIG. 8, hollows (gouges) are generated at an intermediate part of the sapphire substrate in the thickness direction and concavities and convexities are formed in the side surfaces of the divided optical devices.

Therefore, an object of the present invention is to provide a processing method of an optical device wafer by which the optical device wafer can be divided into individual optical device chips without formation of concavities and convexities due to hollows (gouges) in the side surfaces.

In accordance with an aspect of the present invention, there is provided a processing method of an optical device wafer in which an optical device wafer obtained by forming a light emitting layer on a surface of a sapphire substrate and forming an optical device in each of a plurality of regions marked out by a plurality of planned dividing lines in a lattice manner is divided into individual optical device chips. The processing method includes a shielded tunnel forming step of irradiating the sapphire substrate with a pulse laser beam having such a wavelength as to be transmitted through the sapphire substrate along regions corresponding to the planned dividing lines in such a manner that a light focus point of the pulse laser beam is positioned inside the sapphire substrate from a back surface side of the sapphire substrate, and growing fine pores and amorphous regions that shield the fine pores to form shielded tunnels along the planned dividing lines. The processing method further includes a dividing step of giving an external force to the optical device wafer for which the shielded tunnel forming step has been carried out, and dividing the optical device wafer into the individual optical device chips along the planned dividing lines. In the shielded tunnel forming step, a spherical aberration is generated in the pulse laser beam after passing through a condensing lens by causing the pulse laser beam to be incident on the condensing lens with a divergence angle.

Preferably, in the shielded tunnel forming step, the pulse laser beam is caused to have the divergence angle by a concave lens disposed on an upstream side of the condensing lens. Preferably, focal length of the concave lens is set to −0.1 m to −5 m.

According to the processing method of an optical device wafer in accordance with the present invention, in the shielded tunnel forming step, the sapphire substrate is irradiated with the pulse laser beam in which the spherical aberration is generated by causing the pulse laser beam to be incident on the condensing lens with the divergence angle. Thus, the shielded tunnels are evenly formed over the range from the back surface of the sapphire substrate to the front surface. Therefore, hollows (gouges) are not generated at an intermediate part of the sapphire substrate in the thickness direction and concavities and convexities are not formed in the side surfaces of the divided optical device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
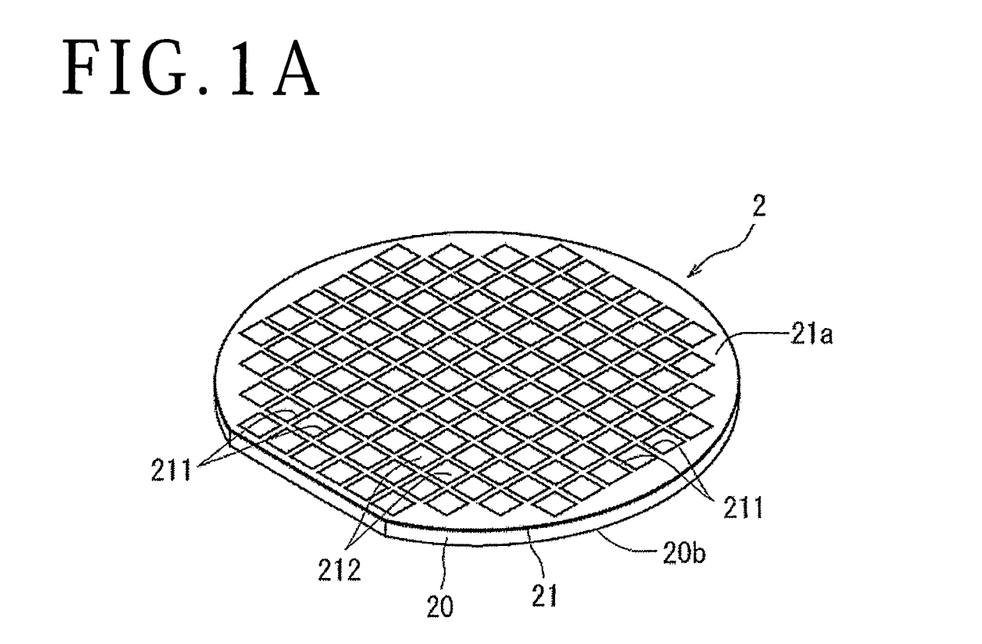
FIG. 1A is a perspective view of an optical device wafer.
Figure 1B:
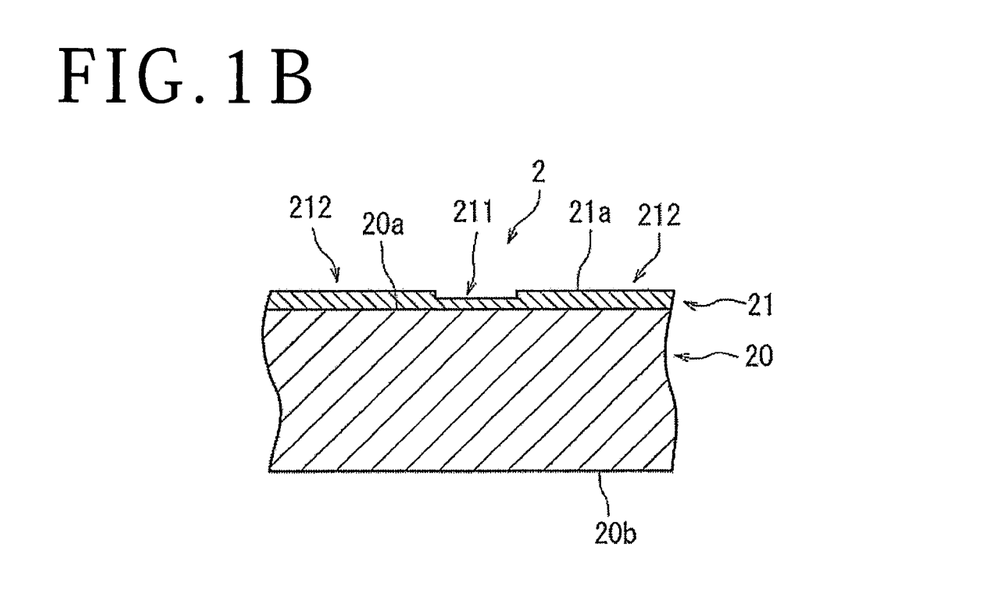
FIG. 1B is a sectional view showing the major part of the optical device wafer in an enlarged manner.

A processing method of an optical device wafer according to the present invention will be described in more detail below with reference to the accompanying drawings. In FIG. 1A and FIG. 1B, a perspective view of an optical device wafer to be processed by the processing method of an optical device wafer according to the present invention and a sectional view of the major part of the optical device wafer are shown. An optical device wafer 2 is formed by stacking a light emitting layer 21 composed of an n-type gallium nitride semiconductor layer and a p-type gallium nitride semiconductor layer to a thickness of 10 μm by an epitaxial growth method on a front surface 20a of a sapphire ($Al_2O_3$) substrate 20 having a thickness of 500 μm. In the light emitting layer 21, optical devices 212 are formed in plural regions marked out by plural planned dividing lines 211 formed in a lattice manner.

Figure 2A:
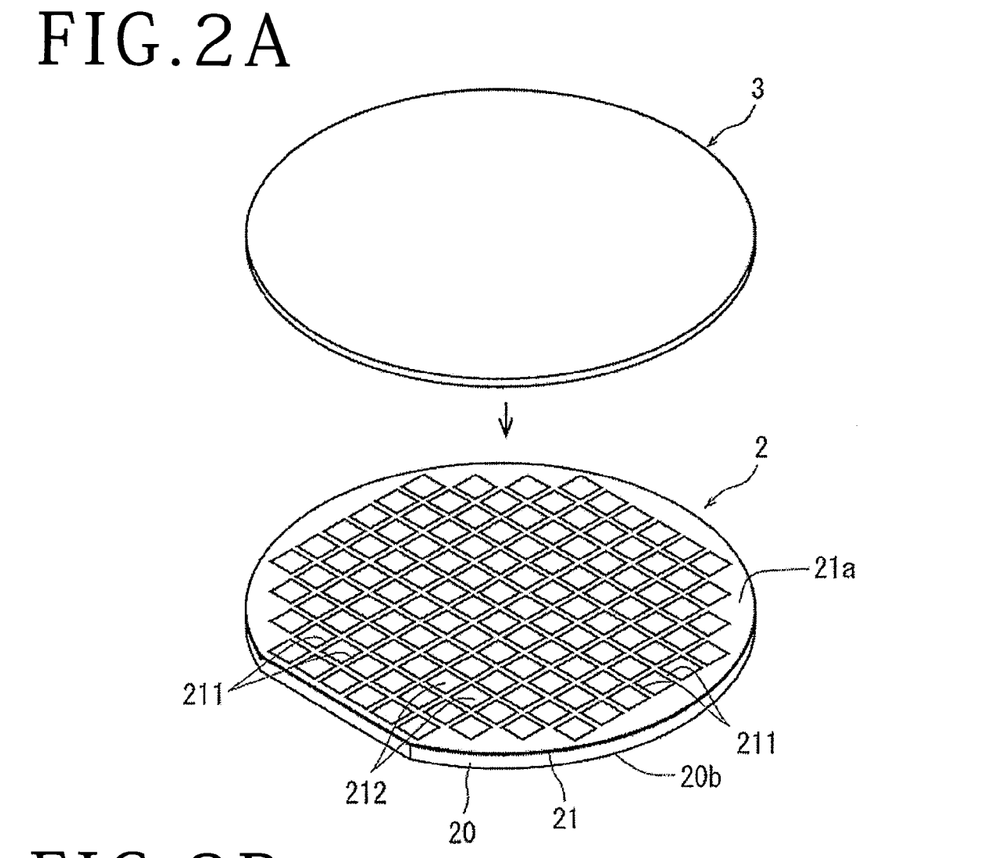
FIG. 2A and FIG. 2B are explanatory diagrams of a protective tape sticking step.
Figure 2B:
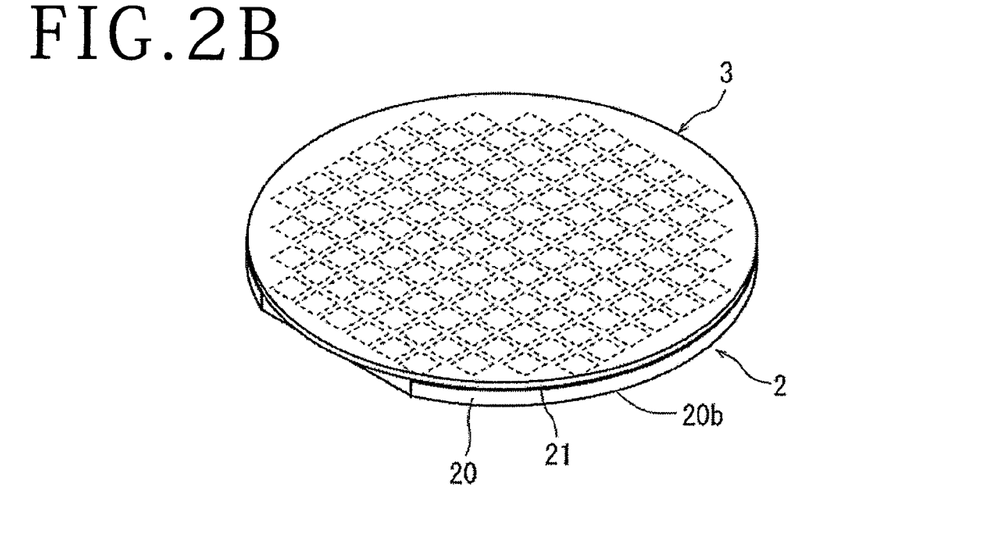

In the processing method of an optical device wafer in which the optical device wafer 2 is divided into individual optical device chips along the planned dividing lines, first, a protective tape sticking step of sticking a protective tape to a front surface 21a of the light emitting layer 21 is carried out in order to protect the optical devices 212 formed in the front surface 21a of the light emitting layer 21 forming the optical device wafer 2. Specifically, a protective tape 3 is stuck to the front surface 21a of the light emitting layer 21 forming the optical device wafer 2 as shown in FIG. 2A and FIG. 2B. In the protective tape 3, an acrylic resin adhesive layer is provided to a thickness of approximately 5 μm on a surface of an acrylic resin sheet having a thickness of 100 μm in the present embodiment.

After the above-described protective tape sticking step is carried out, a shielded tunnel forming step is carried out in which the sapphire substrate 20 is irradiated with a pulse laser beam having such a wavelength as to be transmitted through the sapphire substrate 20 along regions corresponding to the planned dividing lines 211, with the light focus point of the pulse laser beam positioned inside the sapphire substrate 20 from the back surface side, and fine pores and amorphous regions that shield the fine pores are grown to form shielded tunnels along the planned dividing lines. This shielded tunnel forming step is carried out by using laser processing apparatus 4 shown in FIG. 3 in the present embodiment. The laser processing apparatus 4 shown in FIG. 3 includes a chuck table 41 that holds a processing-target object, laser beam irradiation means 42 that irradiates the processing-target object held on the chuck table 41 with a laser beam, and imaging means 43 that images the processing-target object held on the chuck table 41. The chuck table 41 is configured to hold the processing-target object by suction. The chuck table 41 is moved in a processing feed direction shown by an arrow X in FIG. 3 by processing feed means (not shown) and is moved in an indexing feed direction shown by an arrow Y in FIG. 3 by indexing feed means (not shown).

Figure 4:
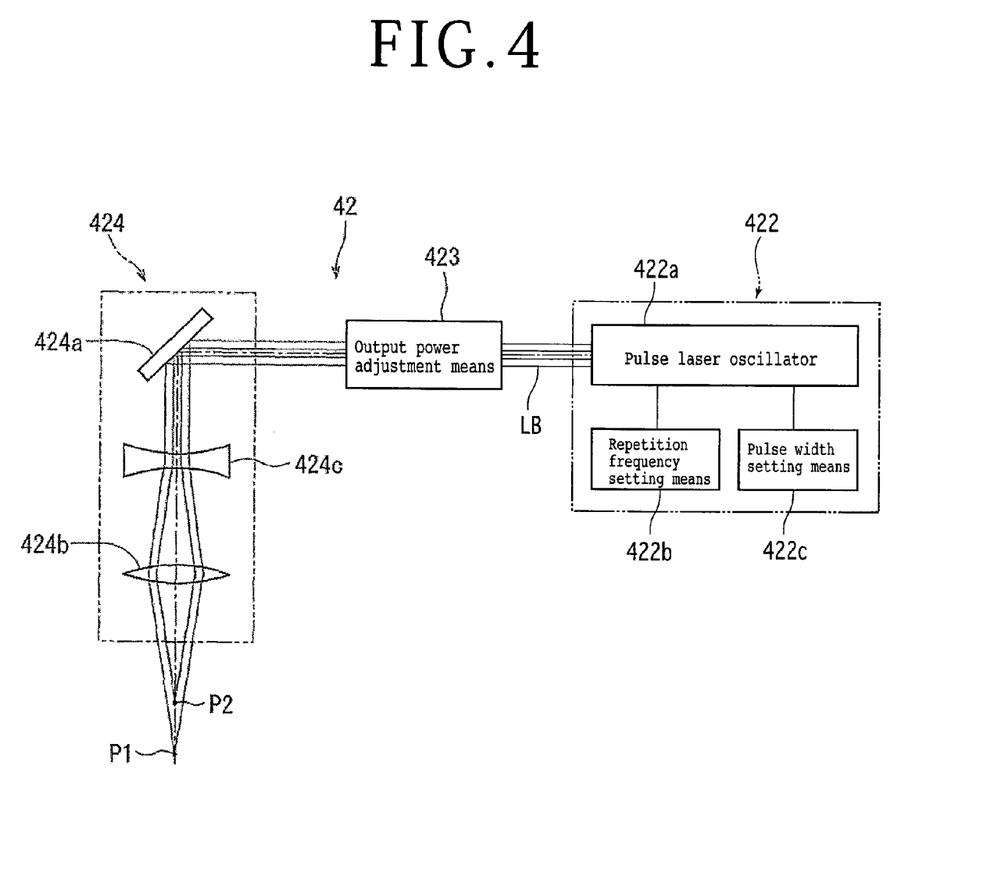
FIG. 4 is a block configuration diagram of laser beam irradiation means mounted in the laser processing apparatus shown in FIG. 3.

The laser beam irradiation means 42 includes a casing 421 that is horizontally disposed substantially and has a cylindrical shape. As shown in FIG. 4, the laser beam irradiation means 42 includes pulse laser beam oscillation means 422 disposed in the casing 421, output power adjustment means 423 that adjusts the output power of a pulse laser beam oscillated from the pulse laser beam oscillation means 422, and a light condenser 424 that condenses the pulse laser beam whose output power is adjusted by the output power adjustment means 423 and emits the pulse laser beam to the optical device wafer 2 as a processing-target object held by the holding surface that is the upper surface of the chuck table 41. The pulse laser beam oscillation means 422 is composed of a pulse laser oscillator 422*a*, repetition frequency setting means 422*b* that sets the repetition frequency of the pulse laser beam oscillated by the pulse laser oscillator 422*a*, and pulse width setting means 422*c* that sets the pulse width of the pulse laser beam oscillated by the pulse laser oscillator 422*a*. In the present embodiment, the pulse laser beam oscillation means 422 configured in this manner oscillates a pulse laser beam LB whose wavelength is 1030 nm. The pulse laser beam oscillation means 422 and the output power adjustment means 423 are controlled by control means (not shown).

The light condenser 424 is composed of the following components: a direction conversion mirror 424*a* that converts the direction of the pulse laser beam LB that is oscillated from the pulse laser beam oscillation means 422 and has the output power adjusted by the output power adjustment means 423 to a downward direction in FIG. 4; a condensing lens 424*b* that condenses the pulse laser beam LB whose direction is converted by the direction conversion mirror 424*a* and emits the pulse laser beam LB to the processing-target object held by the holding surface that is the upper surface of the chuck table 41; and a concave lens 424*c* that is disposed on the upstream side of the condensing lens 424*b* and causes the pulse laser beam LB to have a divergence angle. The numerical aperture (NA) of the condensing lens 424*b* of the light condenser 424 is set as follows. Specifically, regarding the numerical aperture (NA) of the condensing lens 424*b*, a value obtained by dividing the numerical aperture (NA) by the refractive index of the sapphire ($Al_2O_3$) substrate is set in a range of 0.05 to 0.2. Therefore, because the refractive index of the sapphire ($Al_2O_3$) substrate is 1.7, the numerical aperture (NA) of the condensing lens 424*b* is set in a range of 0.085 to 0.34. The laser beam irradiation means 42 includes light focus point position adjustment means (not shown) for adjusting the light focus point position of the pulse laser beam condensed by the condensing lens 424*b* of the light condenser 424.

The concave lens 424*c* disposed on the upstream side of the condensing lens 424*b* guides the pulse laser beam whose direction is converted by the direction conversion mirror 424*a* to the condensing lens 424*b* with a divergence angle. Therefore, due to the disposing of the concave lens 424*c*, a spherical aberration is generated in a range from P1 to P2 in the pulse laser beam condensed by the condensing lens 424*b* as shown in FIG. 4. The range of the spherical aberration can be adjusted based on the focal length (f) of the concave lens 424*c* and it is desirable to set the focal length (f) of the concave lens 424*c* to −0.1 m to −5 m.

In the above-described embodiment, the example in which the concave lens 424*c* for guiding the pulse laser beam to the condensing lens 424*b* with a divergence angle is used as means that generates a spherical aberration is shown. However, the spherical aberration generating means such as a concave lens does not necessarily need to be provided if the pulse laser beam itself oscillated from the pulse laser beam oscillation means 422 has a predetermined divergence angle.

The imaging means 43 mounted to the tip part of the casing 421 forming the laser beam irradiation means 42 is composed of, besides a normal imaging element (charge-coupled device (CCD)) that carries out imaging by a visible light ray, infrared illumination means that irradiates a processing-target object with an infrared ray, an optical system that captures the infrared ray emitted by this infrared illumination means, an imaging element (infrared CCD) that outputs an electrical signal corresponding to the infrared ray captured by this optical system, and so forth. The imaging means 43 sends an image signal obtained by imaging to the control means (not shown).

Figure 3:
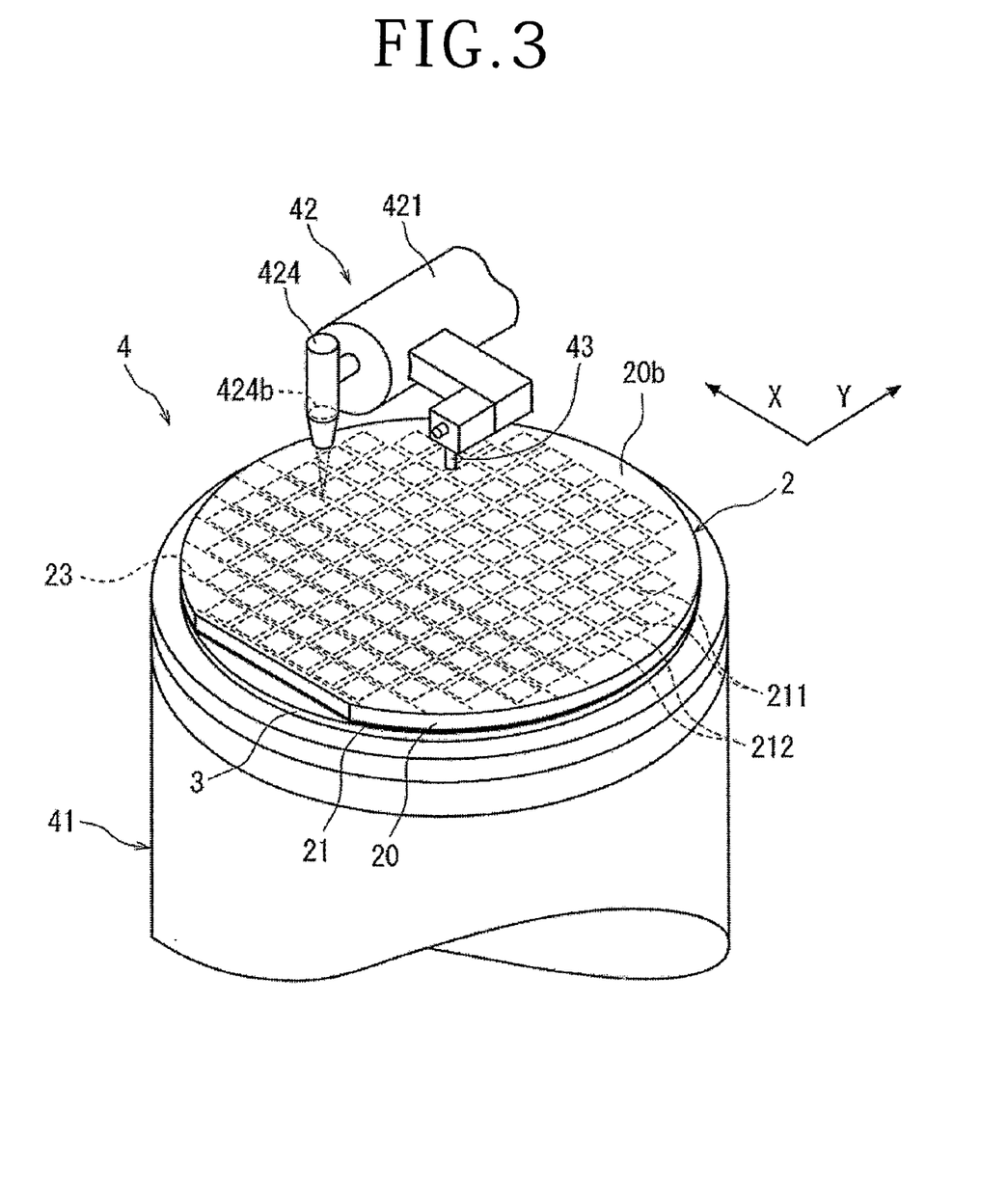
FIG. 3 is a perspective view of the major part of laser processing apparatus for carrying out a shielded tunnel forming step.

To carry out the above-described shielded tunnel forming step for the optical device wafer 2 for which the above-described protective tape sticking step has been carried out by using the laser processing apparatus 4 configured as above, the side of the protective tape 3 to which the optical device wafer 2 is stuck is placed on the chuck table 41 of the laser processing apparatus 4 shown in FIG. 3. Then, the optical device wafer 2 is held over the chuck table 41 with the intermediary of the protective tape 3 by actuating suction means (not shown) (wafer holding step). Therefore, in the optical device wafer 2 held by the chuck table 41, a back surface 20*b* of the sapphire substrate 20 is on the upper side. The chuck table 41 that holds the optical device wafer 2 by suction in this manner is positioned directly under the imaging means 43 by the processing feed means (not shown).

When the chuck table 41 is positioned directly under the imaging means 43, alignment work of detecting the processing region in which laser processing should be carried out in the optical device wafer 2 is executed by the imaging means 43 and the control means (not shown). Specifically, the imaging means 43 and the control means (not shown) execute image processing such as pattern matching for carrying out position adjustment between the planned dividing lines 211 formed along a first direction of the optical device wafer 2 and the light condenser 424 of the laser beam irradiation means 42 that emits a laser beam along the planned dividing lines 211, and implements alignment of the laser beam irradiation position (alignment step). Furthermore, alignment of the laser beam irradiation position is similarly implemented also regarding the planned dividing lines 211 formed along the direction orthogonal to the first direction in the optical device wafer 2. In the alignment step, the light emitting layer 21 in which the planned dividing lines 211 and the optical devices 212 are formed in the optical device wafer 2 is located on the lower side. However, the imaging means 43 can image the planned dividing lines 211 through the sapphire substrate 20 because having the imaging means composed of the infrared illumination means, the optical system that captures an infrared ray, the imaging element (infrared CCD) that outputs an electrical signal corresponding to the infrared ray, and so forth as described above.

Figure 5A:
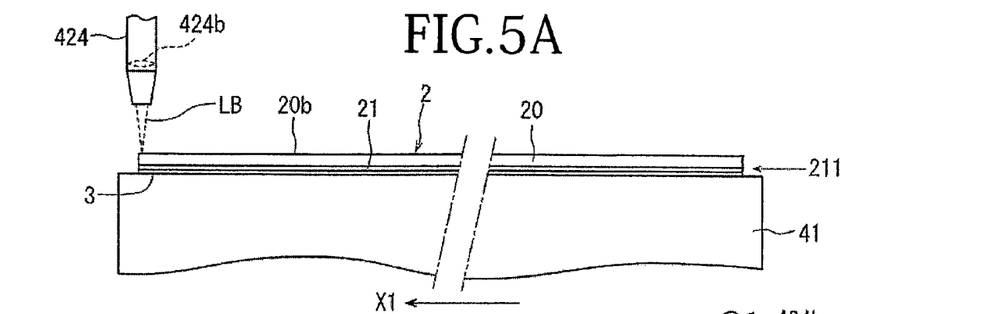
FIG. 5A to FIG. 5E are explanatory diagrams of the shielded tunnel forming step.
Figure 5B:
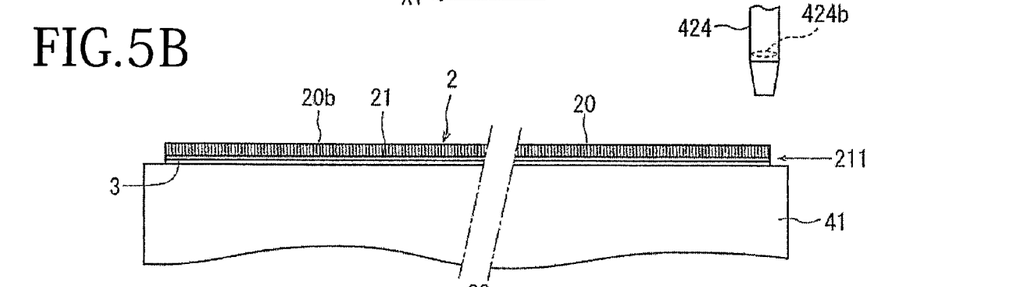
Figure 5C:
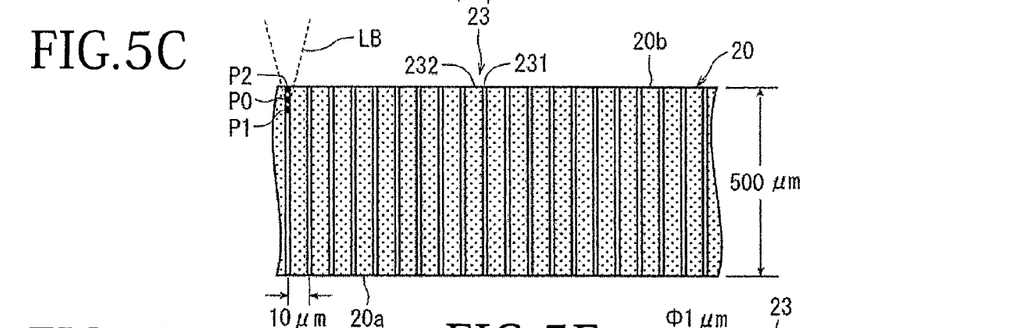

After the above-described alignment step is carried out, as shown in FIG. 5A, the chuck table 41 is moved to the laser beam irradiation region above which the light condenser 424 of the laser beam irradiation means 42 that emits a laser beam is located, and the predetermined planned dividing line 211 is positioned directly under the light condenser 424. At this time, the optical device wafer 2 is so positioned that one end (left end in FIG. 5A) of the planned dividing line 211 is located directly under the light condenser 424 as shown in FIG. 5A. Then, as shown in FIG. 5C, the light condenser 424 is moved in the optical axis direction by actuating the light focus point position adjustment means (not shown) in such a manner that an intermediate point P0 of the range from P1 to P2 that is the range of the spherical aberration of the pulse laser beam LB emitted from the condensing lens 424b of the light condenser 424 is positioned at a desired position from the back surface 20b of the sapphire substrate 20 in the thickness direction (positioning step). In the present embodiment, the intermediate point P0 of the range from P1 to P2 that is the range of the spherical aberration of the pulse laser beam LB emitted from the condensing lens 424b is set at a desired position from the back surface 20b of the sapphire substrate 20 on which the pulse laser beam is made incident in the optical device wafer 2 (for example, position reached by movement from the back surface 20b to the side of the front surface 20a by 76 μm).

After the positioning step is carried out as described above, the shielded tunnel forming step is carried out in which the laser beam irradiation means 42 is actuated to emit the pulse laser beam LB from the light condenser 424 and shielded tunnels are formed through formation of fine pores and amorphous regions that shield the fine pores from the vicinity of the range (P1 to P2) (on the side of the back surface 20b) of the spherical aberration of the pulse laser beam LB emitted from the condensing lens 424b positioned above the sapphire substrate 20 forming the optical device wafer 2 toward the front surface 20a. Specifically, the chuck table 41 is moved in a direction shown by an arrow X1 in FIG. 5A at a predetermined feed speed while the pulse laser beam LB having such a wavelength as to be transmitted through the sapphire ($Al_2O_3$) substrate 20 forming the optical device wafer 2 is emitted from the light condenser 424 (shielded tunnel forming step). Then, when the other end (right end in FIG. 5B) of the planned dividing line 211 reaches the laser beam irradiation position of the light condenser 424 of the laser beam irradiation means 42 as shown in FIG. 5B, the emission of the pulse laser beam is stopped and the movement of the chuck table 41 is stopped.

The processing condition of the above-described shielded tunnel forming step is set to a processing condition shown below.

Wavelength: 1030 nm
Repetition frequency: 40 kHz
Pulse width: 10 ps
Average output power: 0.5 W
Spot diameter: 5 μm
Processing feed speed: 400 mm/second
Numerical aperture of condensing lens: 0.25

Figure 5D:
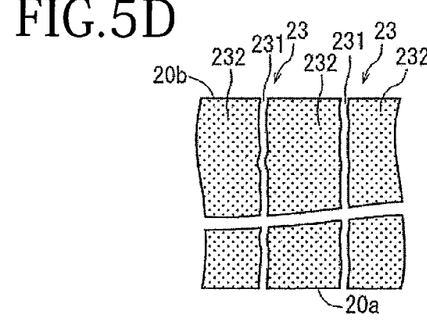
Figure 5E:
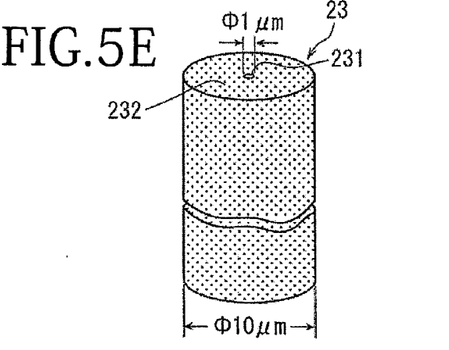

By carrying out the above-described shielded tunnel forming step, inside the sapphire substrate 20 forming the optical device wafer 2, fine pores 231 and amorphous regions 232 formed around these fine pores 231 grow from the vicinity of an aberration light focus point P (back surface 20b) toward the front surface 20a as shown in FIG. 5C and amorphous shielded tunnels 23 are formed at predetermined intervals (in the embodiment shown in the diagram, intervals of 10 μm (processing feed speed: 400 mm/second)/(repetition frequency: 40 kHz)) along the planned dividing lines 211. As shown in FIG. 5D and FIG. 5E, the shielded tunnel 23 formed in this manner is composed of the fine pore 231 that is formed at the center and has a diameter of approximately 1 μm and the amorphous region 232 that is formed around the fine pore 231 and has a diameter of 10 μm. In the present embodiment, the shielded tunnels 23 have a form in which the amorphous regions 232 adjacent to each other are continuously formed to be joined to each other. In the shielded tunnel forming step, the sapphire substrate 20 is irradiated with the pulse laser beam LB emitted from the condensing lens 424b in the state in which the spherical aberration is generated as described above. Thus, the shielded tunnels 23 are evenly formed over the range from the back surface of the sapphire substrate 20 to the front surface and therefore hollows (gouges) are not generated at an intermediate part in the thickness direction.

Figure 6:
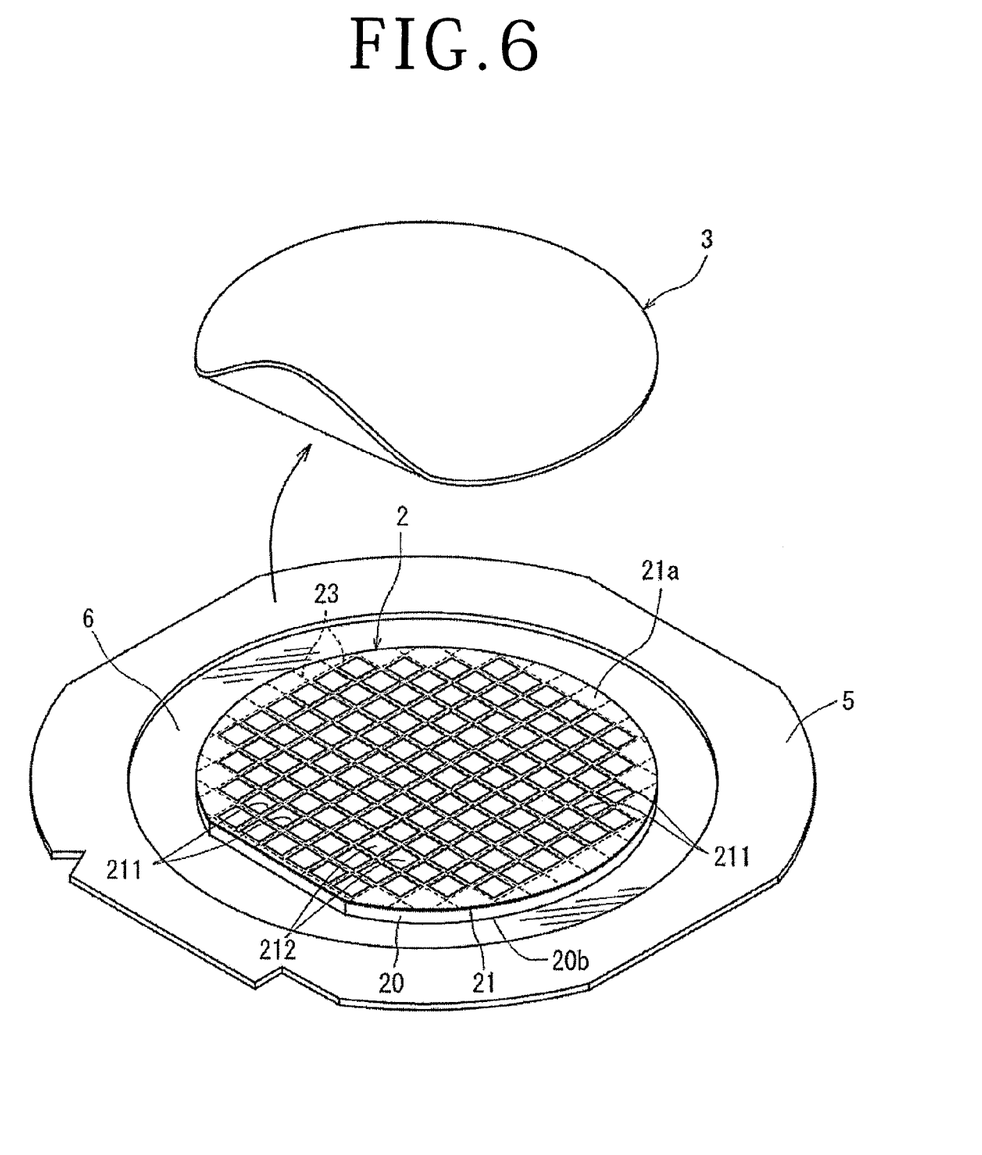
FIG. 6 is an explanatory diagram of a wafer supporting step.

After the shielded tunnel forming step is carried out in the above-described manner, a wafer supporting step of sticking a dicing tape to the back surface 20b of the sapphire substrate 20 forming the optical device wafer 2 and supporting the peripheral part of this dicing tape by a ring-shaped frame is carried out. Specifically, as shown in FIG. 6, the back surface 20b of the sapphire substrate 20 forming the optical device wafer 2 is stuck to a surface of a dicing tape 6 whose peripheral part is mounted to cover the inside opening part of a ring-shaped frame 5. Then, the protective tape 3 stuck to the front surface 21a of the light emitting layer 21 forming the optical device wafer 2 is removed. Therefore, in the optical device wafer 2 stuck to the surface of the dicing tape 6, the front surface 21a of the light emitting layer 21 is on the upper side.

Figure 7A:
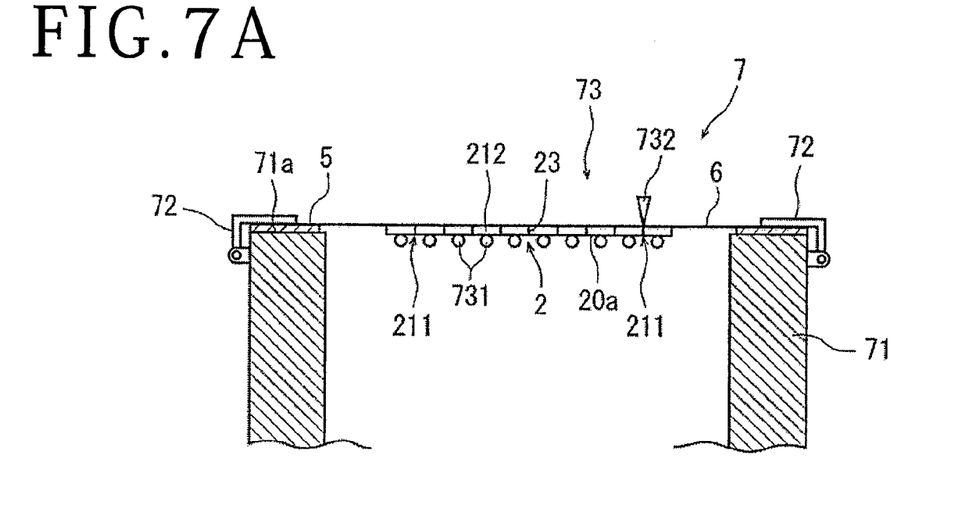
FIG. 7A to FIG. 7C are explanatory diagrams of a dividing step.
Figure 7B:
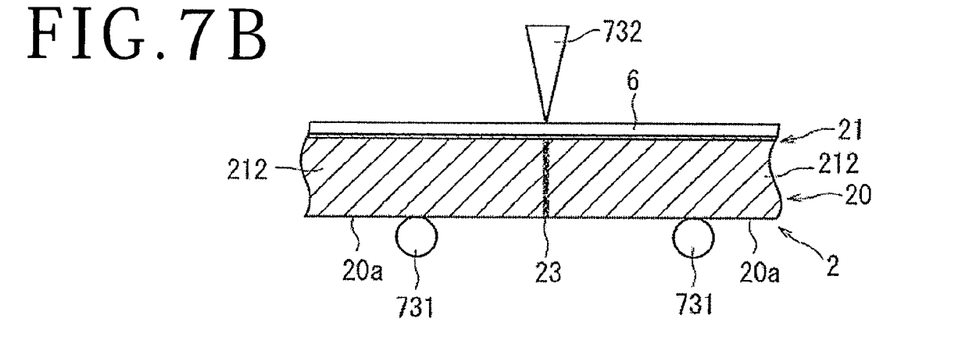
Figure 7C:
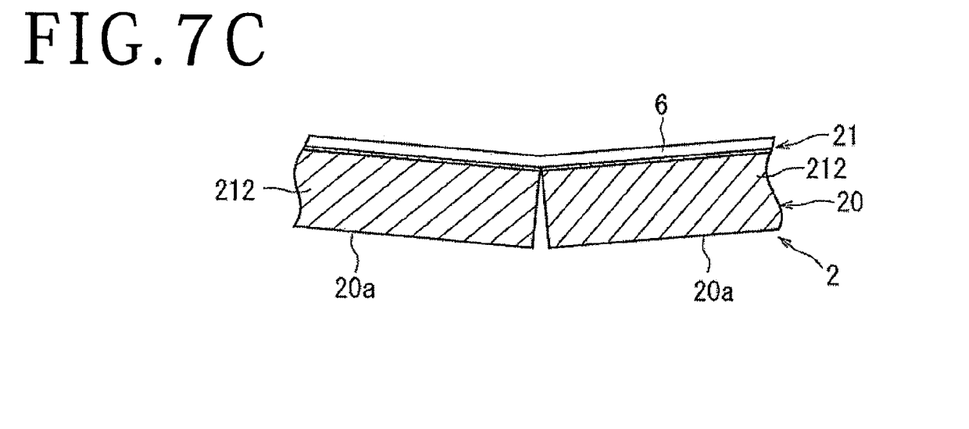

Next, a dividing step of giving an external force to the optical device wafer 2 and dividing the optical device wafer 2 into chips having the individual optical devices 212 along the planned dividing lines 211 is carried out. This dividing step is carried out by using dividing apparatus 7 shown in FIG. 7A. Specifically, the ring-shaped frame 5 that supports the optical device wafer 2 for which the above-described wafer supporting step has been carried out with the intermediary of the dicing tape 6 is placed on a placement surface 71a of a cylindrical base 71, with the side of the dicing tape 6 set on the upper side, and the ring-shaped frame 5 is fixed by clamps 72 disposed at the outer circumference of the cylindrical base 71. Then, the side of the sapphire substrate 20 forming the optical device wafer 2 is placed on plural support members 731 each having a circular column shape that form bending load giving means 73 and are disposed in parallel. At this time, the ring-shaped frame 5 is so placed that the shielded tunnel 23 formed along the planned dividing line 211 is positioned between the support members 731 as shown in FIG. 7B. Then, a pressing member 732 is positioned at the position corresponding to the planned dividing line 211 at the rightmost end in FIG. 7A, supported between the support members 731, on the dicing tape 6 stuck to the back surface 20b of the sapphire substrate 20 forming the optical device wafer 2, and carries out pressing (dividing step). As a result, a bending load acts on the optical device wafer 2 along the shielded tunnels 23 formed along the planned dividing line 211 at the rightmost end in FIG. 7A and a tensile load is generated on the side of the shielded tunnels 23 exposed to the side of the front surface 20a of the sapphire substrate 20. Thus, the shielded tunnels 23 formed along the planned dividing line 211 serve as the start point of dividing and the optical device wafer 2 is divided along the planned dividing line 211 as shown in FIG. 7C. This dividing step is sequentially carried out along the planned dividing lines 211 supported between the support members 731 until the planned dividing line 211 at the leftmost end in FIG. 7A.

The shielded tunnels 23 that serve as the start point of the above-described dividing and are formed in the sapphire substrate 20 are evenly formed over the range from the back surface of the sapphire substrate 20 to the front surface because the sapphire substrate 20 is irradiated with the pulse laser beam LB emitted from the condensing lens 424b in the state in which a spherical aberration is generated as described above in the shielded tunnel forming step shown in the above-described FIG. 5A to FIG. 5E. Thus, hollows (gouges) are not generated at an intermediate part in the thickness direction and concavities and convexities based on the hollows (gouges) like those formed in the processing method of the prior art shown in the above-described FIG. 8 are not formed in the side surfaces of the optical devices 212 divided as shown in FIG. 7C.

After the optical device wafer 2 is divided along the shielded tunnels 23 formed along the planned dividing lines 211 extending along the first direction inside the sapphire substrate 20 forming the optical device wafer 2 in the above-described manner, the cylindrical base 71 is rotated by 90 degrees and the above-described dividing step is carried out along the shielded tunnels 23 formed along the planned dividing lines 211 extending along the direction orthogonal to the first direction. This can divide the optical device wafer 2 into chips having the individual optical devices 212.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of an optical device wafer in which an optical device wafer obtained by forming a light emitting layer on a surface of a sapphire substrate and forming an optical device in each of a plurality of regions marked out by a plurality of planned dividing lines in a lattice manner is divided into individual optical device chips, the processing method comprising:

a shielded tunnel forming step of irradiating the sapphire substrate with a pulse laser beam having such a wavelength as to be transmitted through the sapphire substrate along regions corresponding to the planned dividing lines in such a manner that a light focus point of the pulse laser beam is positioned inside the sapphire substrate from a back surface side of the sapphire substrate, and growing fine pores and amorphous regions that shield the fine pores to form shielded tunnels along the planned dividing lines, wherein in the shielded tunnel forming step, the pulse laser beam is caused to have the divergence angle by a concave lens disposed on an upstream side of the condensing lens; and a dividing step of giving an external force to the optical device wafer for which the shielded tunnel forming step has been carried out, and dividing the optical device wafer into the individual optical device chips along the planned dividing lines, wherein in the shielded tunnel forming step, a spherical aberration is generated in the pulse laser beam after passing through a condensing lens by causing the pulse laser beam to be incident on the condensing lens with a divergence angle.

2. The processing method of an optical device according to claim 1, wherein focal length of the concave lens is set to −0.1 m to −5 m.

* * * * *